US008879295B1

(12) United States Patent
Barth, Jr. et al.

(10) Patent No.: US 8,879,295 B1
(45) Date of Patent: Nov. 4, 2014

(54) ELECTRONIC CIRCUIT FOR REMAPPING FAULTY MEMORY ARRAYS OF VARIABLE SIZE

(71) Applicant: International Business Machines Corporation, Armonk, NY (US)

(72) Inventors: John E. Barth, Jr., Williston, VT (US); Dean L. Lewis, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/958,754

(22) Filed: Aug. 5, 2013

(51) Int. Cl.
*G11C 15/00* (2006.01)
*G11C 29/04* (2006.01)
*G11C 29/00* (2006.01)

(52) U.S. Cl.
CPC ............... *G11C 29/04* (2013.01); *G11C 15/00* (2013.01); *G11C 29/808* (2013.01)
USPC .................. 365/49.17; 365/200; 365/201

(58) Field of Classification Search
CPC ........... G11C 13/0014; G11C 13/0069; G11C 15/00; G11C 29/04; G11C 29/785; G11C 29/808; G11C 29/846
USPC ............................... 365/49.17, 168, 200, 201
See application file for complete search history.

(56) References Cited

U.S. PATENT DOCUMENTS

| | | | |
|---|---|---|---|
| 5,406,565 A | 4/1995 | MacDonald | |
| 5,831,913 A | 11/1998 | Kirihata | |
| 5,831,914 A | 11/1998 | Kirihata | |
| 5,838,893 A | 11/1998 | Douceur | |
| 5,881,003 A | 3/1999 | Kirihata et al. | |
| 5,920,512 A | 7/1999 | Larsen | |
| 5,940,335 A | 8/1999 | Kirihata | |
| 5,978,931 A | 11/1999 | Kirihata et al. | |
| 6,243,306 B1 | 6/2001 | Kirihata | |
| 6,678,836 B2 | 1/2004 | Driscoll | |
| 7,243,290 B2 | 7/2007 | Slavin | |
| 7,430,145 B2 * | 9/2008 | Weiss et al. ................... | 365/200 |
| 7,624,313 B2 | 11/2009 | Wickeraad et al. | |
| 7,966,518 B2 | 6/2011 | Bosch et al. | |
| 2005/0081093 A1 | 4/2005 | Joly | |
| 2006/0215432 A1 | 9/2006 | Wickeraad et al. | |
| 2011/0219260 A1 | 9/2011 | Nobunaga et al. | |
| 2012/0266016 A1 | 10/2012 | Huang | |

OTHER PUBLICATIONS

Shyue-Kung Lu et al., "Efficient Built-In Redundancy Analysis for Embedded Memories with 2-D Redundancy", pp. 1-5, 2006.
Isidoros Sideris et al., "Cost Effective Protection Techniques for TCAM Memory Arrays", IEEE Transactions on Computers, vol. 61, No. 12, pp. 1778-1788, Dec. 2012.

* cited by examiner

*Primary Examiner* — Tan T. Nguyen
(74) *Attorney, Agent, or Firm* — Gibb & Riley, LLC

(57) ABSTRACT

A memory under repair having variable size blocks of failed memory addresses is connected to a TCAM comprising cells storing data values of ranges of the failed memory addresses in the memory under repair. The TCAM is connected to a virtual address line. Matchlines in the TCAM drive wordlines in a RAM connected to the TCAM. Each entry in the TCAM corresponds to one entry in the RAM and represents a single block of failed memory addresses. A first input of an XOR gate in an integrated circuit device is operatively connected to the RAM and a second input is operatively connected to the virtual address line. Responsive to a virtual address being an address in one of the ranges of failed memory addresses, the XOR gate calculates a physical memory address redirecting the virtual address to an unused good memory location in place of the failed memory address.

20 Claims, 11 Drawing Sheets

ELECTRONIC CIRCUIT FOR REMAPPING FAULTY MEMORY ARRAYS OF VARIABLE SIZE

BACKGROUND

The present disclosure relates to fault-tolerant memory in integrated electronic circuits, and more specifically, to systems and methods to redirect virtual addresses for replacing defective elements of variable size in memory devices.

A memory chip with even a single failed array cannot be sold, which significantly degrades product yield. A known solution is to provide spare arrays to replace the failed ones. There are two problems with this solution. First, as memory size grows, the cost of providing a spare memory array increases and the effectiveness decreases; for 3-D stacked memories, a spare memory array will not suffice. Second, a spare memory array is almost entirely useless in recovering from memory architecture faults (e.g. faults in the address and data buses); for 3-D memories, faults in the 3-D interconnect are a serious risk, so a circuit that can repair these faults is needed.

SUMMARY

Methods and systems herein take failed memory addresses and remap them to good locations elsewhere in the memory, creating a smaller, unified, all-good memory space. By remapping to other memory locations, methods and systems herein avoid the cost and limitations of providing spare memory arrays. Methods and systems herein have the flexibility to work at any granularity (wordline, subarray, macro, 3-D stratum, etc.), which allows recovery from memory architecture faults. Such recovery may be accomplished by using a Ternary Content Addressable Memory (TCAM) to match failed address ranges and redirect addresses in those ranges to good memory locations.

According to an integrated circuit structure, a memory under repair having variable size blocks of failed memory addresses is operatively connected to a Ternary Content Addressable Memory (TCAM). The TCAM is operatively connected to a victual address line. The TCAM comprises cells storing data values comprising ranges of failed memory addresses in the memory under repair. A random-access memory (RAM) is operatively connected to the TCAM. Matchlines in the TCAM drive wordlines in the RAM. Each entry in the TCAM corresponds to one entry in the RAM and represents a single block of failed memory addresses. An exclusive-OR (XOR) gate in the integrated circuit device has two inputs. A first input is operatively connected to the RAM and a second input is operatively connected to the virtual address line. Responsive to a virtual address being an address in one of the ranges of failed memory addresses in the memory under repair, the XOR gate calculates a physical memory address redirecting the virtual address to an unused good memory location in place of the failed memory address in the memory under repair.

According to a method herein, a Ternary Content Addressable Memory (TCAM) is configured with data values comprising ranges of failed memory addresses in a memory under repair having variable size blocks of failed memory addresses, using a computerized device. A virtual address is received, using the computerized device. At least a portion of the virtual address is applied to the TCAM, using the computerized device. A match is identified in the TCAM indicating the virtual address is in a range of the failed memory addresses in the memory under repair, using the computerized device. Wordlines in an associated random-access memory (RAM) are driven by matchlines in the TCAM, using the computerized device. Each entry in the TCAM corresponds to one entry in the RAM and represents a single block of failed memory addresses. A mask value from the RAM is output as a first input to an exclusive-OR (XOR) gate, using the computerized device. The virtual address is applied as a second input to the XOR gate, using the computerized device. The virtual address is remapped, using the XOR gate, to a physical address for a good memory address in the memory under repair, using the computerized device.

A system herein comprises a memory under repair having variable size blocks of failed memory addresses and a Ternary Content Addressable Memory (TCAM) comprising cells storing data values comprising ranges of said failed memory addresses in the memory under repair. A random-access memory (RAM) is operatively connected to the TCAM. Matchlines in the TCAM drive wordlines in the RAM. Each entry in the TCAM corresponds to one entry in the RAM and represents a single block of failed memory addresses. The system includes a processor. The processor identifies failed memory address ranges in the memory under repair. The processor identifies unused good memory locations in the memory under repair. The processor calculates a physical memory address in the unused good memory locations in the memory under repair for a virtual address in the failed memory address ranges. The processor redirects the virtual address in the failed memory address ranges to the physical memory address in the unused good memory locations.

BRIEF DESCRIPTION OF THE DRAWINGS

The systems and methods herein will be better understood from the following detailed description with reference to the drawings, which are not necessarily drawn to scale and in which.

DETAILED DESCRIPTION

Figure 1:
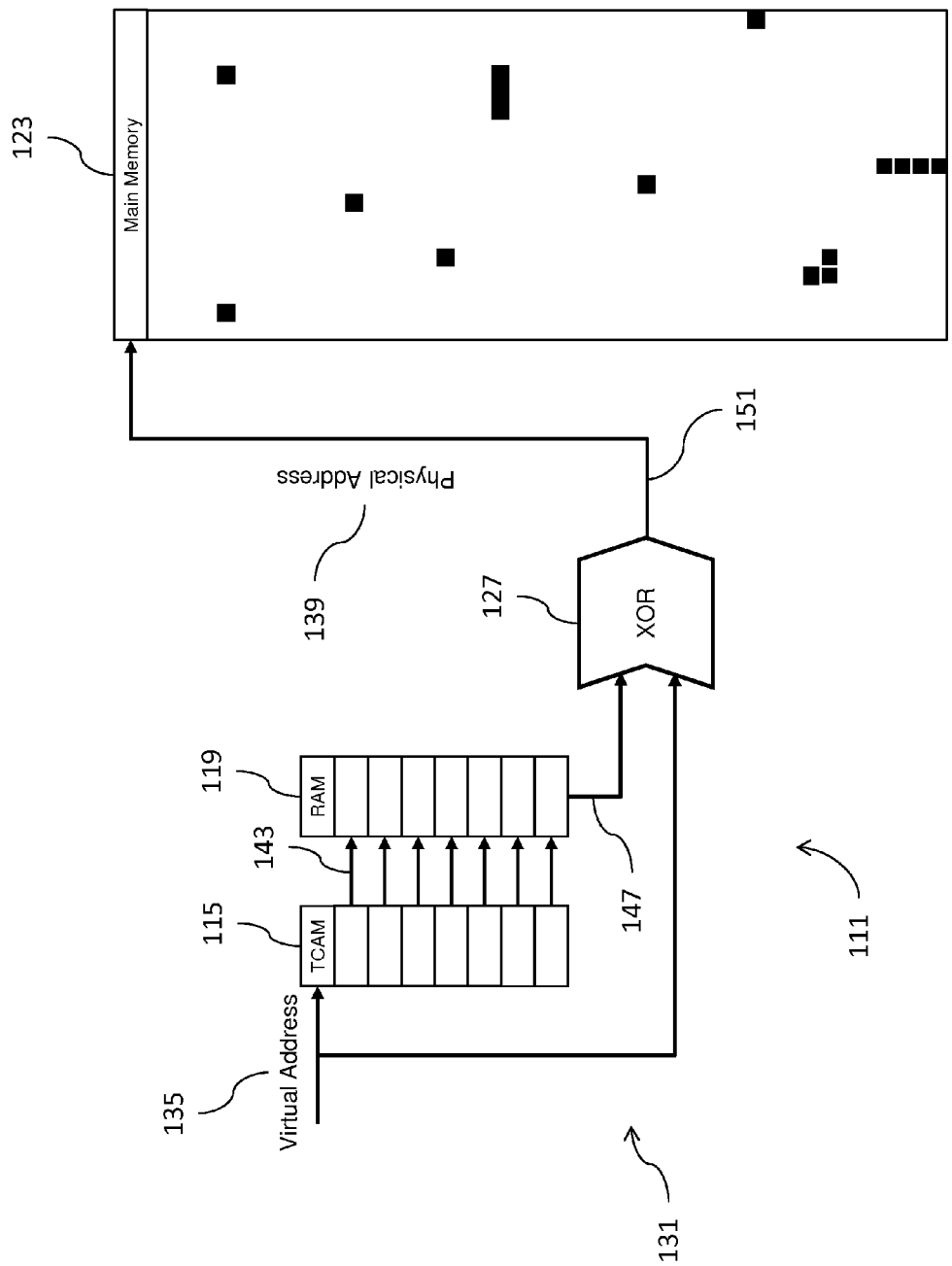
FIG. 1 is a system overview illustrating various aspects of systems and methods herein.

It will be readily understood that the systems and methods of the present disclosure, as generally described and illustrated in the drawings herein, may be arranged and designed in a wide variety of different configurations in addition to the systems and methods described herein. Thus, the following detailed description of the systems and methods, as represented in the drawings, is not intended to limit the scope defined by the appended claims, but is merely representative of selected systems and methods. The following description is intended only by way of example, and simply illustrates certain concepts of the systems and methods, as disclosed and claimed herein.

Disclosed herein is a circuit for mapping faulty memory arrays of variable size to other portions of the physical memory space. With this circuit, a memory system containing faulty arrays can present a single, unified address space to the client machine. Mapping variable size memory arrays is critical because it can repair a large variety of physical defects with many less repair resources than a fixed-size scheme.

Referring to FIG. 1, a system, indicated generally as 111, is shown. The system 111 comprises three memories: (1) a Ternary Content Addressable Memory (TCAM) 115, (2) a random-access memory (RAM) 119, and (3) a main memory 123. Faulty address ranges in the main memory 123, sometimes referred to herein as the memory under repair, are repaired by a circuit, indicated generally as 131, comprising the TCAM 115, RAM 119, and an exclusive-OR (XOR) gate 127. According to systems and methods herein, the main memory 123 can be any memory technology (SRAM, DRAM, eDRAM, MRAM, PCM, Flash, etc.). Similarly, tables in the TCAM 115 and RAM 119 can be implemented in any type of memory.

An input to the circuit 131 is a virtual address 135, which is provided by a client machine. The output of the circuit 131 is a physical address 139, which is used to index the physical memory space in the main memory 123. The mapping process from virtual address 135 to physical address 139 uses the three circuit blocks. The first block of the circuit 131 is the Ternary Content Addressable Memory (TCAM) 115. The TCAM 115 provides four values: 0, 1, "don't care" or "always match", indicated by *, and "never match", indicated by a blank. The TCAM 115 searches on the virtual address 135 to determine if the virtual address 135 must be remapped—the third state of the TCAM 115 ("always-match") is what enables variable size mapping. Depending on the programmed contents of the TCAM 115, the repair action can repair a block-size of 1, 2, 4, 8, up to 2^n addresses, where n is the width of the TCAM table.

The matchlines 143 of the TCAM 115 are taken as inputs to the wordlines of the second circuit block of the circuit 131, the Random Access Memory (RAM) 119. If a virtual address 135 matches an entry in the TCAM 115 (indicating that the virtual address 135 is in a range of failed memory blocks in the main memory 123), the RAM 119 delivers remapping data for that virtual address 135. Specifically, the remapping data is a bit vector (called a mask) that designates which bits in the virtual address 135 to flip and which to maintain (1 indicates a flip, 0 indicates a hold). The third block of the circuit 131 is the bitwise exclusive-OR (XOR) gate 127. The XOR gate 127 is used to perform the flip of the bits in the virtual address 135. This is done by XOR-ing each bit in the virtual address 135 with the corresponding bit in the mask (as described in further detail below), producing the physical address 139.

The RAM 119 produces the mask vector, which will be zero if the virtual address 135 points to a good memory location in the main memory 123 and non-zero if the virtual address 135 points to a bad memory location n the main memory 123. The output 147 of the RAM 119 is the first input to the XOR gate 127.

Every virtual address 135 produced by the client passes through the circuit 131 on its way to the main memory 123. The TCAM 115 performs a simultaneous bitwise comparison of the incoming virtual address 135 with all entries in the TCAM 115. If the virtual address 135 points to a good address, the TCAM produces no match signals, no entries are activated in the RAM, and so the default value of all-zero is output 147 to the first input of the XOR gate 127. All-zero means the XOR gate 127 does not change any of the bits of the virtual address 135, so the physical address 139 is identical to the virtual address 135. If the virtual address 135 points to a bad address in the main memory 123, the TCAM 115 produces one match signal, the corresponding entry in the RAM 119 is activated, and the mask in this entry is output 147 to the first input of the XOR gate 127. This non-zero means that some or all of the bits in the virtual address 135 are altered to produce the physical address 139. In this way, distinguishing between a virtual address 135 pointing to a good address and a virtual address 135 pointing to a bad address is done automatically. The output 151 of the XOR gate 127 is the final, safe address that is then used to access the main memory 123.

Figure 3:
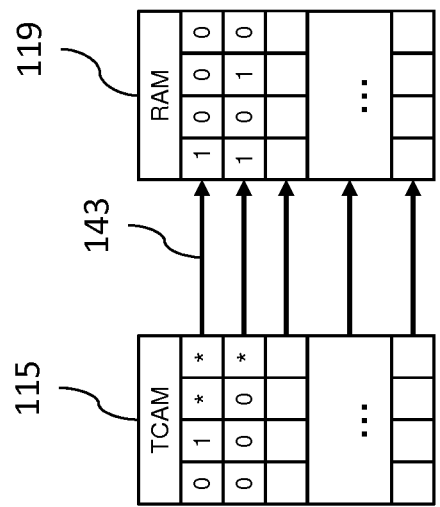
FIG. 3 is a block diagram illustrating an exemplary programming of elements of the circuit according to systems and methods herein.
Figure 2:
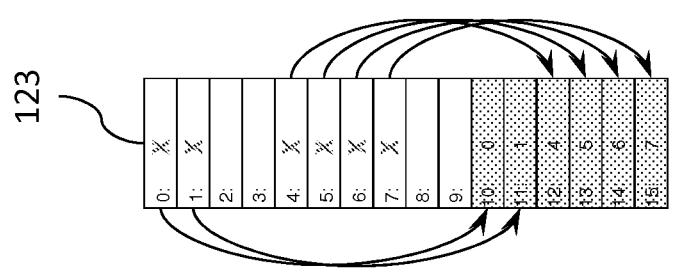
FIG. 2 is a block diagram illustrating an exemplary remapping of memory address according to systems and methods herein.

FIG. 2 shows an exemplary fail map (addresses 0, 1, 4, 5, 6, and 7 are faulty) and a mapping. Address 0 remaps to address 10, address 1 remaps to address 11, address 4 remaps to address 12, address 5 remaps to address 13, address 6 remaps to address 14, and address 7 remaps to address 15. From this mapping, the contents of the TCAM 115 and the contents of the RAM 119 may be generated and programmed, see FIG. 3. Each entry in the TCAM 115 may correspond to one entry in the RAM 119 with a matchline 143. An entry in the TCAM 115 represents a single block of failed addresses in the main memory 123. As shown in FIG. 3, it is not necessary for all entries to be utilized. Any unused entries in the TCAM 115 are programmed with all zeros, which prevents those entries from matching at all (Note: a TCAM entry programmed with all zeros is distinct from a TCAM programmed to match all zeros).

Figure 4:
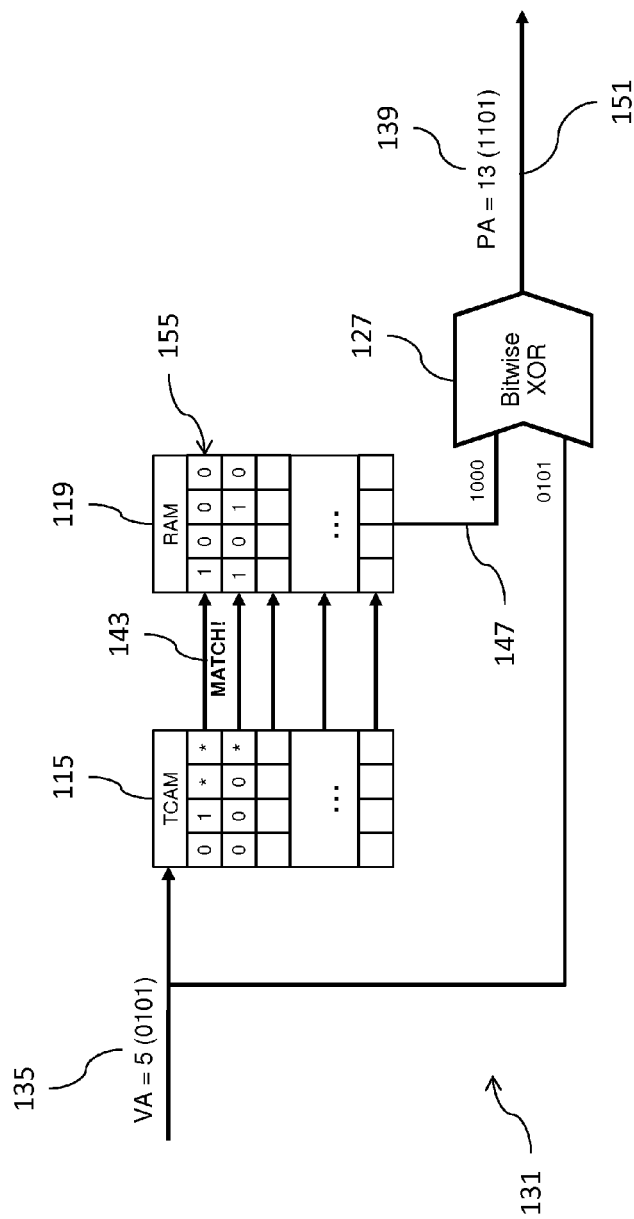
FIG. 4 is a block diagram illustrating a specific example of the operation of the systems and methods herein.

FIG. 4 shows the operation of the circuit 131 given the specific mapping. An input virtual address of 5 (0101) is provided to the TCAM 115. The first entry of the TCAM 115 shows a match (0101 matches 01**), so the RAM 119 produces a mask 155. In this example the bit pattern for the mask is 1000. The mask 155 is XORed in a bitwise fashion with the input, 0101, to produce 1101. This gives a new physical address, 13, as specified in the mapping.

The examples herein show a 16-entry memory space. It is contemplated that this could be 16 subarrays within a macro, 16 macros in a chip, 16 chips in a 3-D memory, or any other level in the hierarchy. Additionally, the number of entries could be 4, 16, 64 k, or any other number. The scale of the memory space and the number of entries in the address space are simply the parameters of a given specific implementation of the circuit and immaterial to the general design.

Figure 5:
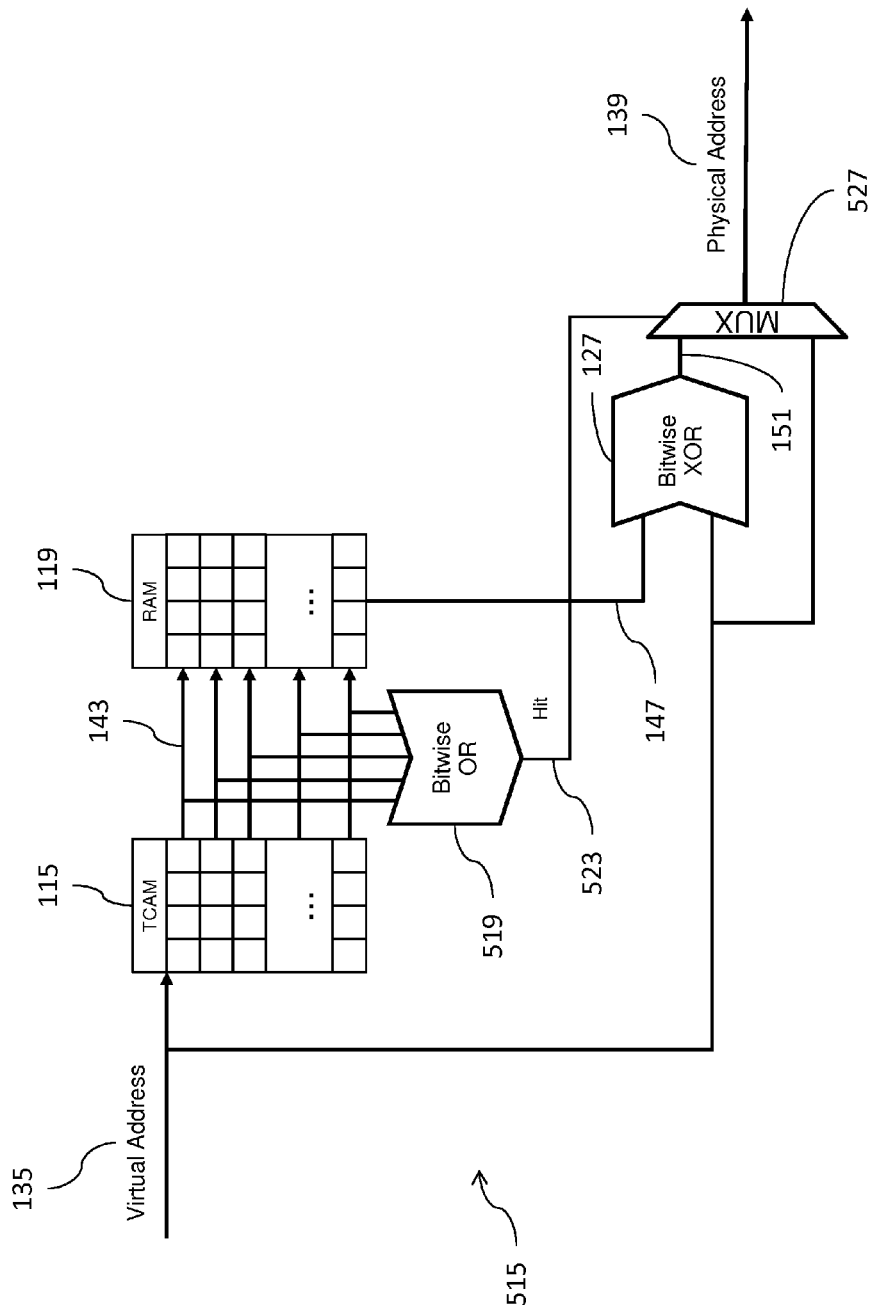
FIG. 5 is a block diagram illustrating a specific example of systems and methods herein.

Furthermore, the example shown in FIGS. 1 and 4 assume that the RAM 119 produces an all-zeros mask when no wordlines are activated (i.e. when a match does not occur in the TCAM 115). If the behavior of the RAM 119 is not fixed, a circuit 515, such as shown in FIG. 5 can be used. Two circuit blocks have been added to the circuit 515. One block is an OR gate 519, which detects a match with any entry in the TCAM 115 by tapping off the matchlines 143. The output 523 of the OR gate 519 is called a 'hit'. The second additional block is a multiplexer (MUX) 527, which selects between the virtual address 135 and the output 151 of the XOR gate 127, which is the masked virtual address. The MUX 527 is controlled by the hit signal, which is the output 523 of the OR gate 519. If the virtual address 135 hits in the TCAM 115, the virtual address 135 is masked to produce the physical address 139, as described above; otherwise, if the virtual address 135 does not hit in the TCAM 115, it is not altered, and the MUX 527 passes the unchanged virtual address 135 as the physical address 139.

According to systems and methods herein, the contents of the TCAM 115 and RAM 119 can be generated off-host and programmed in at power-up. The particular methods of generation and programming are independent of the remapping operation disclosed herein.

Figure 6:
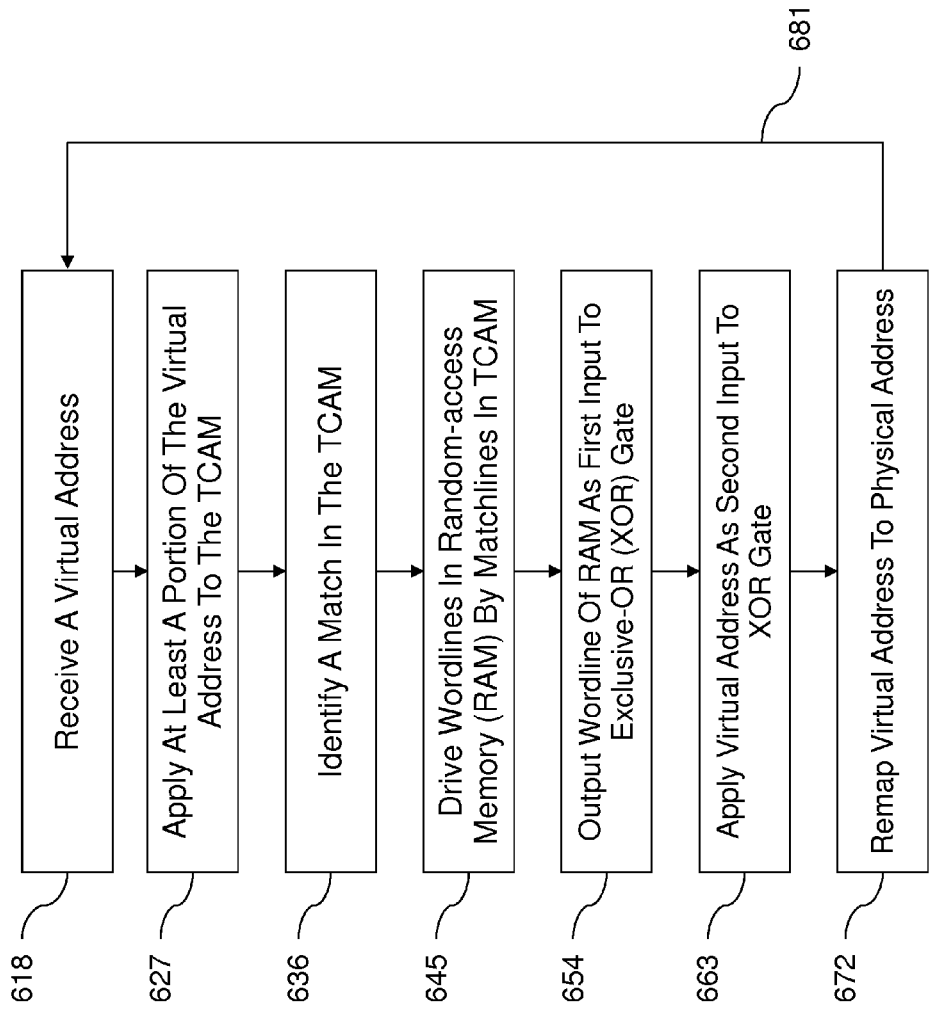
FIG. 6 is a flow diagram illustrating systems and methods herein.

FIG. 6 is a flow diagram illustrating the processing flow of an exemplary method according to systems and methods herein. A Ternary Content Addressable Memory (TCAM) is configured with data values comprising ranges of failed memory addresses in a memory under repair having variable size blocks of failed memory addresses. At 618, a virtual address is received. At least a portion of the virtual address is applied to the TCAM, at 627. At 636, a match is identified in the TCAM indicating the virtual address is in a range of the failed memory addresses in the memory under repair. Wordlines in an associated random-access memory (RAM) are driven by matchlines in the TCAM, at 645. Each entry in the TCAM corresponds to one entry in the RAM and represents a single block of failed memory addresses. At 654, the wordline of the RAM is output as a first input to an exclusive-OR (XOR gate. At 663, the virtual address is applied as a second input to the XOR gate. At 672, the virtual address is remapped, using the XOR gate, to a physical address for a good memory address in the memory under repair. Operation of the circuit continues for the next virtual address received, as indicated by arrow 681.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

For electronic applications, semiconducting substrates, such as silicon wafers, can be used. The substrate enables easy handling of the micro device through the many fabrication steps. Often, many individual devices are made together on one substrate and then singulated into separated devices toward the end of fabrication. In order to fabricate a microdevice, many processes are performed, one after the other, many times repeatedly. These processes typically include depositing a film, patterning the film with the desired micro features, and removing (or etching) portions of the film. For example, in memory chip fabrication, there may be several lithography steps, oxidation steps, etching steps, doping steps, and many others are performed. The complexity of microfabrication processes can be described by their mask count.

An integrated circuit structure according to systems and methods herein may include a memory under repair having variable size blocks of failed memory addresses. The memory under repair is operatively connected to a Ternary Content Addressable Memory (TCAM). The TCAM is operatively connected to a virtual address line. The TCAM comprises cells storing data values comprising ranges of failed memory addresses in the memory under repair. A random-access memory (RAM) is operatively connected to the TCAM. Matchlines in the TCAM drive wordlines in the RAM. Each entry in the TCAM corresponds to one entry in the RAM and represents a single block of failed memory addresses. An exclusive-OR (XOR) gate in the integrated circuit device has two inputs. A first input is operatively connected to the RAM and a second input is operatively connected to the virtual address line. Responsive to a virtual address being an address in one of the ranges of failed memory addresses in the memory under repair, the XOR gate calculates a physical memory address redirecting the virtual address to an unused good memory location in place of the failed memory address in the memory under repair.

Aspects of the present disclosure are described herein with reference to flowchart illustrations and/or block diagrams of methods, apparatus (systems), and computer program products according to various systems and methods. It will be understood that each block of the flowchart illustrations and/or two-dimensional block diagrams, and combinations of blocks in the flowchart illustrations and/or block diagrams, can be implemented by computer program instructions. The computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

According to a further system and method herein, an article of manufacture is provided that includes a tangible computer readable medium having computer readable instructions embodied therein for performing the steps of the computer implemented methods, including, but not limited to, the method illustrated in FIG. 6. Any combination of one or more computer readable non-transitory medium(s) may be utilized. The computer readable medium may be a computer readable signal medium or a computer readable storage medium. The non-transitory computer storage medium stores instructions, and a processor executes the instructions to perform the methods described herein. A computer readable storage medium may be, for example, but not limited to, an electronic, magnetic, optical, electromagnetic, infrared, or semiconductor system, apparatus, or device, or any suitable combination of the foregoing. Any of these devices may have computer readable instructions for carrying out the steps of the methods described above with reference to FIG. 6.

The computer program instructions may be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

Furthermore, the computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

In case of implementing the systems and methods herein by software and/or firmware, a program constituting the software may be installed into a computer with dedicated hardware, from a storage medium or a network, and the computer is capable of performing various functions if with various programs installed therein.

Figure 7:
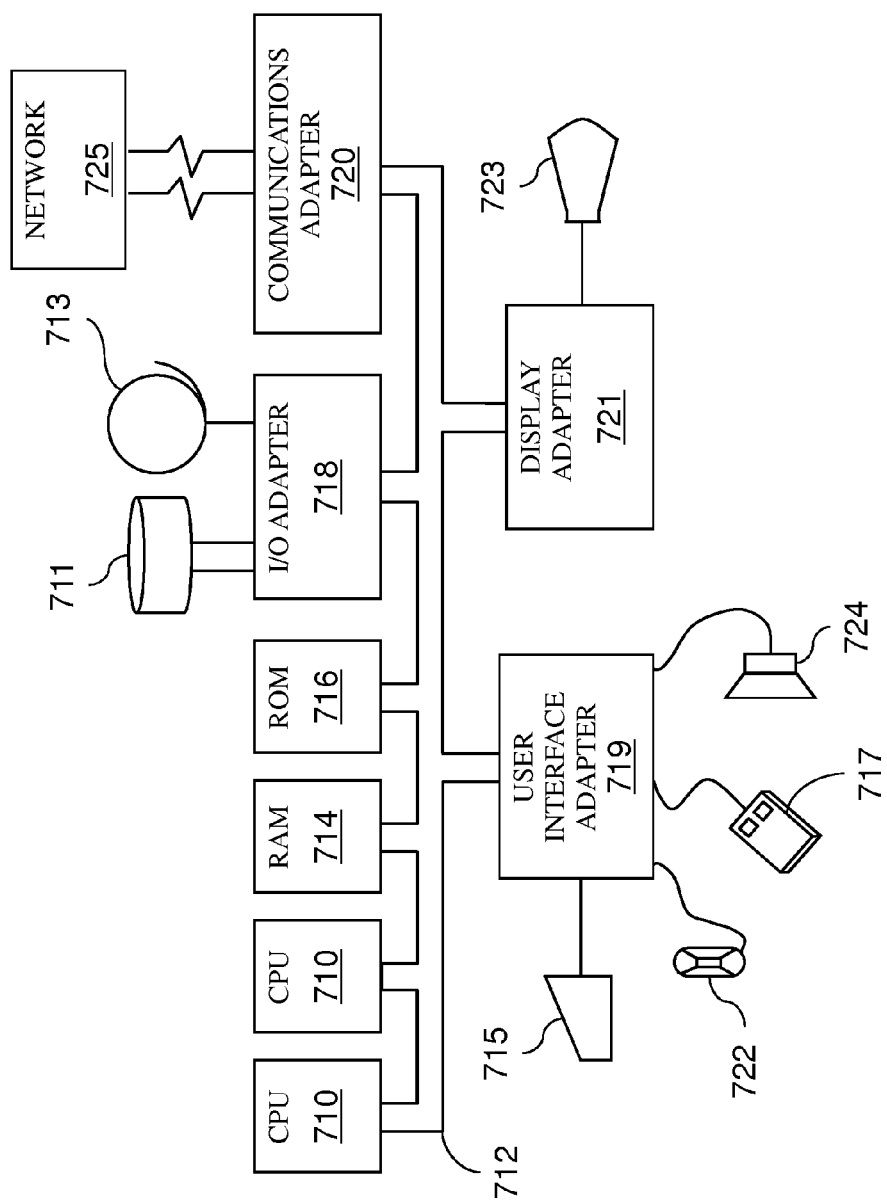
FIG. 7 is a schematic diagram of a hardware system according to systems and methods herein.

A representative hardware environment for practicing the systems and methods herein is depicted in FIG. 7. This schematic drawing illustrates a hardware configuration of an information handling/computer system in accordance with the systems and methods herein. The system comprises at least one processor or central processing unit (CPU) 710. The CPUs 710 are interconnected via system bus 712 to various devices such as a Random Access Memory (RAM) 714, Read-Only Memory (ROM) 716, and an Input/Output (I/O) adapter 718. The I/O adapter 718 can connect to peripheral devices, such as disk units 711 and tape drives 713, or other program storage devices that are readable by the system. The system can read the inventive instructions on the program storage devices and follow these instructions to execute the methodology of the systems and methods herein.

In FIG. 7, CPUs 710 perform various processing based on a program stored in a Read Only Memory (ROM) 716 or a program loaded from a peripheral device, such as disk units 711 and tape drives 713 to a Random Access Memory (RAM) 714. In the RAM 714, required data when the CPUs 710 perform the various processing or the like is also stored, as necessary. The CPUs 710, the ROM 716, and the RAM 714 are connected to one another via a bus 712. An I/O adapter 718 is also connected to the bus 712 to provide an input/output interface, as necessary. A removable medium, such as a magnetic disk, an optical disk, a magneto-optical disk, a semiconductor memory, or the like, is installed on the peripheral device, as necessary, so that a computer program read therefrom may be installed into the RAM 714, as necessary.

The system further includes a user interface adapter 719 that connects a keyboard 715, mouse 717, speaker 724, microphone 722, and/or other user interface devices such as a touch screen device (not shown) to the bus 712 to gather user input. Additionally, a communication adapter 720 including a network interface card such as a LAN card, a modem, or the like connects the bus 712 to a data processing network 725. The communication adapter 720 performs communication processing via a network such as the Internet. A display adapter 721 connects the bus 712 to a display device 723, which may be embodied as an output device such as a monitor (such as a Cathode Ray Tube (CRT), a Liquid Crystal Display (LCD), or the like), printer, or transmitter, for example.

In the case where the above-described series of processing is implemented with software, the program that constitutes the software may be installed from a network such as the Internet or a storage medium such as the removable medium.

Those skilled in the art would appreciate that the storage medium is not limited to the peripheral device having the program stored therein as illustrated in FIG. 7, which is distributed separately from the device for providing the program to the user. Examples of a removable medium include a magnetic disk (including a floppy disk), an optical disk (including a Compact Disk-Read Only Memory (CD-ROM) and a Digital Versatile Disk (DVD)), a magneto-optical disk (including a Mini-Disk (MD) (registered trademark)), and a semiconductor memory. Alternatively, the storage medium may be the ROM 716, a hard disk contained in the storage section of the disk units 711, or the like, which has the program stored therein and is distributed to the user together with the device that contains them.

As will be appreciated by one skilled in the art, aspects of the systems and methods herein may be embodied as a system, method, or computer program product. Accordingly, aspects of the present disclosure may take the form of an entirely hardware system, an entirely software system (including firmware, resident software, micro-code, etc.) or an system combining software and hardware aspects that may all generally be referred to herein as a "circuit," "module", or "system." Furthermore, aspects of the present disclosure may take the form of a computer program product embodied in one or more computer readable medium(s) having computer readable program code embodied thereon.

Any combination of one or more computer readable non-transitory medium(s) may be utilized. The computer readable medium may be a computer readable signal medium or a computer readable storage medium. The non-transitory computer storage medium stores instructions, and a processor executes the instructions to perform the methods described herein. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a Read-Only Memory (ROM), an Erasable Programmable Read-Only Memory (EPROM or Flash memory), an optical fiber, a magnetic storage device, a portable compact disc Read-Only Memory (CD-ROM), an optical storage device, a "plug-and-play" memory device, like a USB flash drive, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including, but not limited to, wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++, or the like and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The flowchart and block diagrams in the Figures illustrate the architecture, functionality, and operation of possible implementations of systems, methods, and computer program products according to various systems and methods herein. In this regard, each block in the flowchart or block diagrams may represent a module, segment, or portion of code, which comprises one or more executable instructions for implementing the specified logical function(s). It should also be noted that, in some alternative implementations, the functions noted in the block might occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Deployment types include loading directly in the client, server, and proxy computers via loading a storage medium such as a CD, DVD, etc. The process software may also be automatically or semi-automatically deployed into a computer system by sending the process software to a central server or a group of central servers. The process software is then downloaded into the client computers that will execute the process software. The process software is sent directly to the client system via e-mail. The process software is then either detached to a directory or loaded into a directory by a button on the e-mail that executes a program that detaches the process software into a directory. Alternatively, the process software is sent directly to a directory on the client computer hard drive. When there are proxy servers, the process will select the proxy server code, determine on which computers to place the proxy servers' code, transmit the proxy server code, and then install the proxy server code on the proxy computer. The process software will be transmitted to the proxy server, and then stored on the proxy server.

While it is understood that the process software may be deployed by manually loading directly in the client, server, and proxy computers via loading a storage medium such as a CD, DVD, etc., the process software may also be automatically or semi-automatically deployed into a computer system by sending the process software to a central server or a group of central servers. The process software is then downloaded into the client computers that will execute the process software. Alternatively, the process software is sent directly to the client system via e-mail. The process software is then either detached to a directory or loaded into a directory by a button on the e-mail that executes a program that detaches the process software into a directory. Another alternative is to send the process software directly to a directory on the client computer hard drive. When there are proxy servers, the process will select the proxy server code, determine on which computers to place the proxy servers' code, transmit the proxy server code, and then install the proxy server code on the proxy computer. The process software will be transmitted to the proxy server, and then stored on the proxy server.

Figure 8:
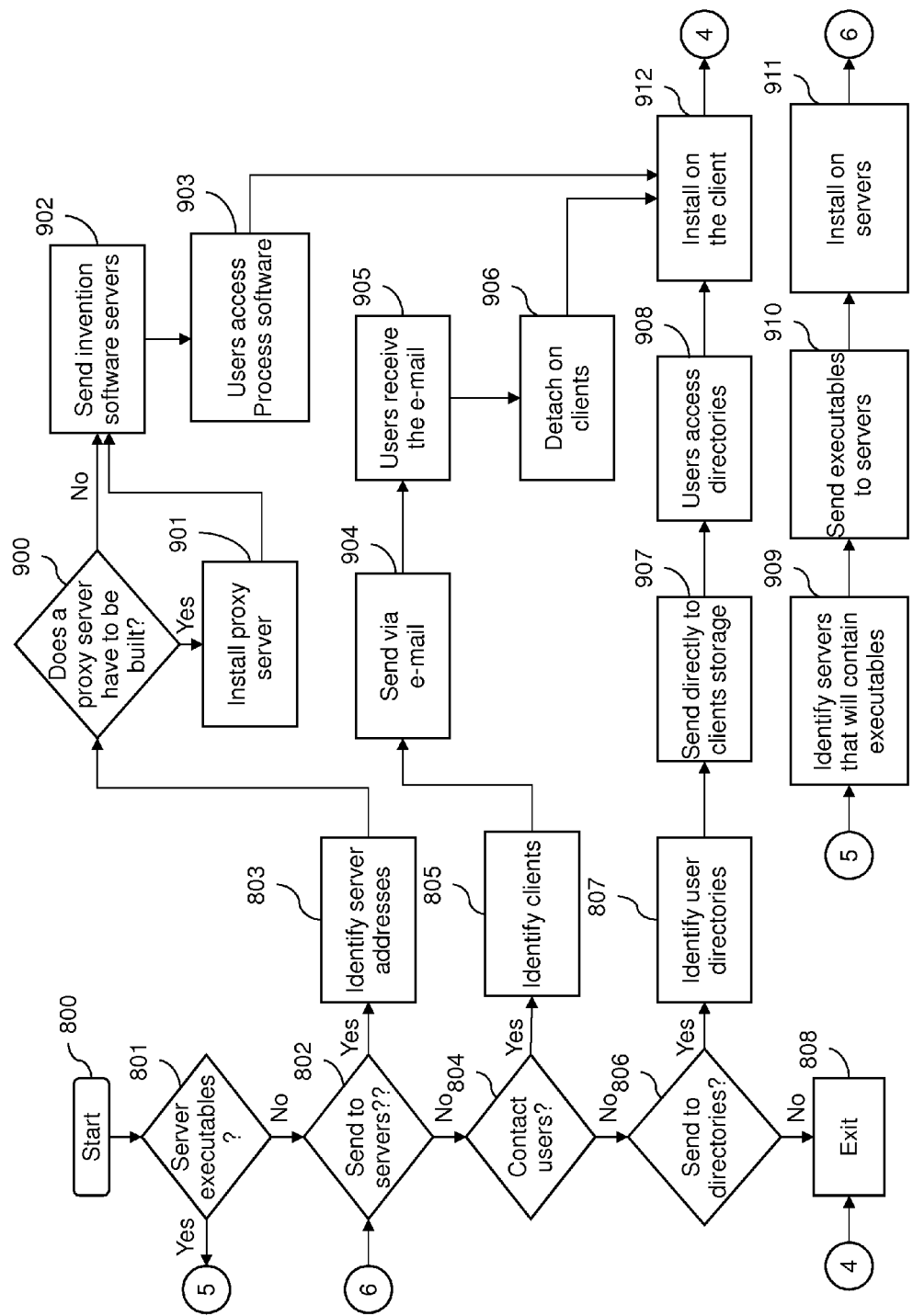
FIG. 8 is a schematic diagram of a deployment system according to systems and methods herein.

In FIG. 8, step 800 begins the deployment of the process software. The first thing is to determine if there are any programs that will reside on a server or servers when the process software is executed 801. If this is the case, then the servers that will contain the executables are identified 909. The process software for the server or servers is transferred directly to the servers' storage via FTP or some other protocol, or by copying through the use of a shared file system 910. The process software is then installed on the servers 911.

Next, a determination is made on whether the process software is to be deployed by having users access the process software on a server or servers 802. If the users are to access the process software on servers, then the server addresses that will store the process software are identified 803.

A determination is made if a proxy server is to be built 900 to store the process software. A proxy server is a server that sits between a client application, such as a Web browser, and a real server. It intercepts all requests to the real server to see if it can fulfill the requests itself. If not, it forwards the request to the real server. The two primary benefits of a proxy server are to improve performance and to filter requests. If a proxy server is required, then the proxy server is installed 901. The process software is either sent to the servers via a protocol such as FTP or it is copied directly from the source files to the server files via file sharing 902. Another method would be to send a transaction to the servers that contain the process software and have the server process the transaction, then receive and copy the process software to the server's file system. Once the process software is stored at the servers, the users, via their client computers, then access the process software on the servers and copy it to their client computers' file systems 903. Another method is to have the servers automatically copy the process software to each client and then run the installation program for the process software at each client computer. The users execute the program that installs the process software on their client computer 912, and then exit the process 808.

In step 804, a determination is made whether the process software is to be deployed by sending the process software to users via e-mail. The set of users where the process software will be deployed are identified together with the addresses of the user client computers 805. The process software is sent via e-mail 904 to each of the users' client computers. The users receive the e-mail 905 and then detach the process software from the e-mail to a directory on their client computers 906. The users execute the program that installs the process software on their client computer 912, and then exit the process 808.

Lastly, a determination is made on whether the process software will be sent directly to user directories on their client computers 806. If so, the user directories are identified 807. The process software is transferred directly to the users' client computer directory 907. This can be done in several ways such as, but not limited to, sharing of the file system directories and then copying from the sender's file system to the recipient users' file system or alternatively using a transfer protocol such as File Transfer Protocol (FTP). The users access the directories on their client file systems in preparation for installing the process software 908. The users execute the program that installs the process software on their client computer 912, and then exit the process 808.

The process software is integrated into a client, server, and network environment by providing for the process software to coexist with applications, operating systems, and network operating systems software, and then installing the process software on the clients and servers in the environment where the process software will function.

The first step is to identify any software on the clients and servers including the network operating system where the process software will be deployed that are required by the process software or that work in conjunction with the process software. This includes the network operating system that is software that enhances a basic operating system by adding networking features.

Next, the software applications and version numbers will be identified and compared to the list of software applications and version numbers that have been tested to work with the process software. Those software applications that are missing or that do not match the correct version will be upgraded with the correct version numbers. Program instructions that pass parameters from the process software to the software applications will be checked to ensure the parameter lists match the parameter lists required by the process software. Conversely, parameters passed by the software applications to the process software will be checked to ensure the parameters match the parameters required by the process software. The client and server operating systems including the network operating systems will be identified and compared to the list of operating systems, version numbers, and network software that have been tested to work with the process software. Those operating systems, version numbers, and network software that do not match the list of tested operating systems and version numbers will be upgraded on the clients and servers to the required level.

After ensuring that the software, where the process software is to be deployed, is at the correct version level that has been tested to work with the process software, the integration is completed by installing the process software on the clients and servers.

Figure 9:
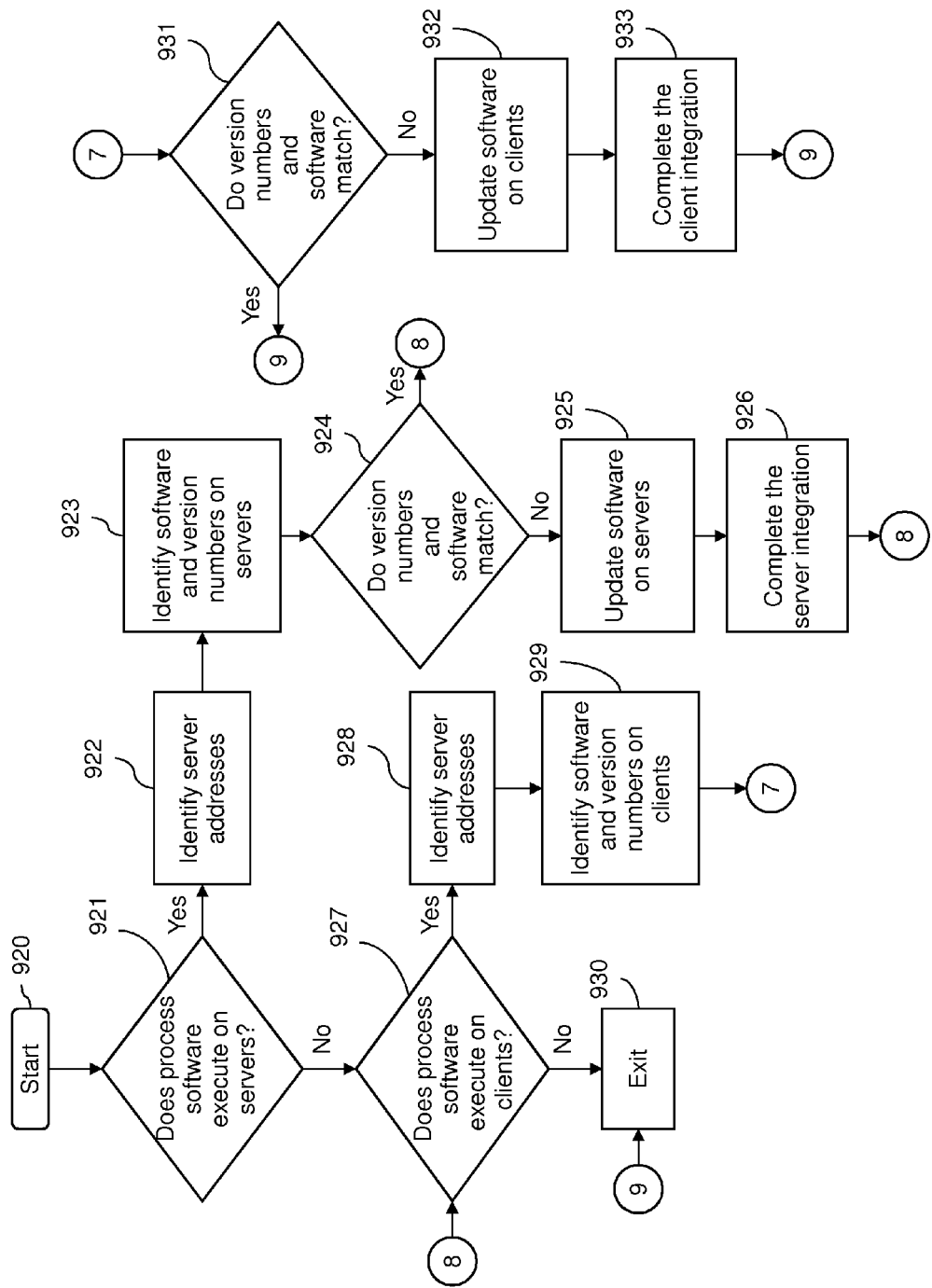
FIG. 9 is a schematic diagram of an integration system according to systems and methods herein.

In FIG. 9, step 920 begins the integration of the process software. The first thing is to determine if there are any process software programs that will execute on a server or servers 921. If this is not the case, then integration proceeds to 927. If this is the case, then the server addresses are identified 922. The servers are checked to see if they contain software that includes the operating system (OS), applications, and network operating systems (NOS), together with their version numbers that have been tested with the process software 923. The servers are also checked to determine if there is any missing software that is required by the process software 923.

A determination is made if the version numbers match the version numbers of OS, applications, and NOS that have been tested with the process software 924. If all of the versions match and there is no missing required software, the integration continues in 927.

If one or more of the version numbers do not match, then the unmatched versions are updated on the server or servers with the correct versions 925. Additionally, if there is missing required software, then it is updated on the server or servers 925. The server integration is completed by installing the process software 926.

Step 927, which follows either step 921, 924, or 926, determines if there are any programs of the process software that will execute on the clients. If no process software programs execute on the clients, the integration proceeds to 930 and exits. If this is not the case, then the client addresses are identified at 928.

The clients are checked to see if they contain software that includes the operating system (OS), applications, and network operating systems (NOS), together with their version numbers that have been tested with the process software 929. The clients are also checked to determine if there is any missing software that is required by the process software 929.

A determination is made as to whether the version numbers match the version numbers of OS, applications, and NOS that have been tested with the process software 931. If all of the versions match and there is no missing required software, then the integration proceeds to 930 and exits.

If one or more of the version numbers do not match, then the unmatched versions are updated on the clients with the correct versions 932. In addition, if there is missing required software then it is updated on the clients 932. Installing the process software on the clients 933 completes the client integration. The integration proceeds to 930 and exits.

The process software can be stored on a shared file system accessible from one or more servers. The process software is executed via transactions that contain data and server processing requests that use CPU units on the accessed server. CPU units are units of time such as minutes, seconds, and hours on the central processor of the server. Additionally, the assessed server may make requests of other servers that require CPU units. CPU units are an example that represents one measurement of use. Other measurements of use include, but are not limited to, network bandwidth, memory usage, storage usage, packet transfers, complete transactions etc. When multiple customers use the same process software application, their transactions are differentiated by the parameters included in the transactions that identify the unique customer and the type of service for that customer. All of the CPU units and other measurements of use that are used for the services for each customer are recorded. When the number of transactions to any one server reaches a number that begins to affect the performance of that server, other servers are accessed to increase the capacity and to share the workload. Likewise, when other measurements of use such as network bandwidth, memory usage, storage usage, etc. approach a capacity so as to affect performance, additional network bandwidth, memory usage, storage etc. are added to share the workload. The measurements of use that are used for each service and customer are sent to a collecting server that sums the measurements of use for each customer for each service that was processed anywhere in the network of servers that provide the shared execution of the process software. The summed measurements of use units are periodically multiplied by unit costs and the resulting total process software application service costs are alternatively sent to the customer and/or indicated on a web site accessed by the customer, which then remits payment to the service provider. In another method, the service provider requests payment directly from a customer account at a banking or financial institution. In another method, if the service provider is also a customer of the customer that uses the process software application, the payment owed to the service provider is reconciled to the payment owed by the service provider to minimize the transfer of payments.

The process software is shared, simultaneously serving multiple customers in a flexible, automated fashion. It is standardized, requiring little customization, and it is scalable, providing capacity On-Demand in a pay-as-you-go model.

The process software can be stored on a shared file system accessible from one or more servers. The process software is executed via transactions that contain data and server processing requests that use CPU units on the accessed server. CPU units are units of time such as minutes, seconds, and hours on the central processor of the server. Additionally, the assessed server may make requests of other servers that require CPU units. CPU units are an example that represents one measurement of use. Other measurements of use include, but are not limited to, network bandwidth, memory usage, storage usage, packet transfers, complete transactions etc.

When multiple customers use the same process software application, their transactions are differentiated by the parameters included in the transactions that identify the unique customer and the type of service for that customer. All of the CPU units and other measurements of use that are used for the services for each customer are recorded. When the number of transactions to any one server reaches a number that begins to affect the performance of that server, other servers are accessed to increase the capacity and to share the workload. Likewise, when other measurements of use such as network bandwidth, memory usage, storage usage, etc. approach a capacity so as to affect performance, additional network bandwidth, memory usage, storage etc. are added to share the workload.

The measurements of use used for each service and customer are sent to a collecting server that sums the measurements of use for each customer for each service that was processed anywhere in the network of servers that provide the shared execution of the process software. The summed measurements of use units are periodically multiplied by unit costs and the resulting total process software application service costs are alternatively sent to the customer and/or indicated on a web site accessed by the customer, which then remits payment to the service provider.

In another method, the service provider requests payment directly from a customer account at a banking or financial institution.

In another method, if the service provider is also a customer of the customer that uses the process software application, the payment owed to the service provider is reconciled to the payment owed by the service provider to minimize the transfer of payments.

Figure 10:
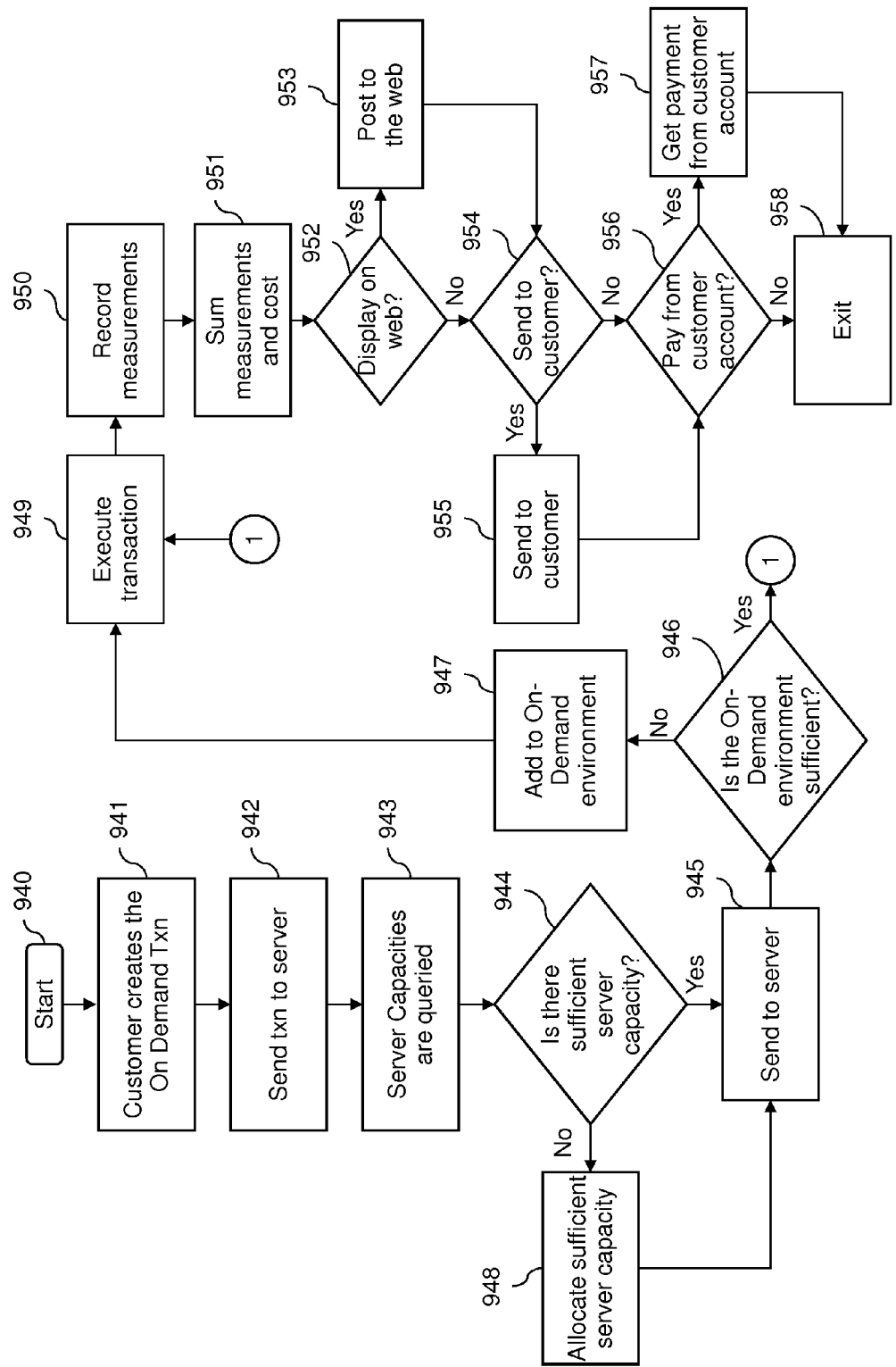
FIG. 10 is a schematic diagram of an On-Demand system according to systems and methods herein.

In FIG. 10, step 940 begins the On-Demand process. A transaction is created that contains the unique customer identification, the requested service type, and any service parameters that further specify the type of service 941. The transaction is then sent to the main server 942. In an On-Demand environment, the main server can initially be the only server, then, as capacity is consumed, other servers are added to the On-Demand environment.

The server central processing unit (CPU) capacities in the On-Demand environment are queried 943. The CPU requirement of the transaction is estimated, and then the servers' available CPU capacity in the On-Demand environment is compared to the transaction CPU requirement to see if there is sufficient CPU capacity available in any server to process the transaction 944. If there is not sufficient server CPU capacity available, then additional server CPU capacity is allocated to process the transaction 948. If there was already sufficient CPU capacity available, then the transaction is sent to a selected server 945.

Before executing the transaction, a check is made of the remaining On-Demand environment to determine if the environment has sufficient available capacity for processing the transaction. This environment capacity consists of such things as, but not limited to, network bandwidth, processor memory, storage etc. 946. If there is not sufficient available capacity, then capacity will be added to the On-Demand environment 947. Next, the required software to process the transaction is accessed, loaded into memory, and then the transaction is executed 949.

The usage measurements are recorded 950. The usage measurements consist of the portions of those functions in the On-Demand environment that are used to process the transaction. The usage of such functions as, but not limited to, network bandwidth, processor memory, storage, and CPU cycles are what are recorded. The usage measurements are summed, multiplied by unit costs, and then recorded as a charge to the requesting customer 951. If the customer has requested that the On-Demand costs be posted to a web site 952, then they are posted 953.

If the customer has requested that the On-Demand costs be sent via e-mail to a customer address 954, then they are sent 955. If the customer has requested that the On-Demand costs be paid directly from a customer account 956, then payment is received directly from the customer account 957. The last step is to exit the On-Demand process 958.

The process software may be deployed, accessed and executed through the use of a virtual private network (VPN), which is any combination of technologies that can be used to secure a connection through an otherwise unsecured or untrusted network. The use of VPNs is to improve security and for reduced operational costs. The VPN makes use of a public network, usually the Internet, to connect remote sites or users together. Instead of using a dedicated, real-world connection such as leased line, the VPN uses "virtual" connections routed through the Internet from the company's private network to the remote site or employee.

The process software may be deployed, accessed, and executed through either a remote-access or a site-to-site VPN. When using the remote-access VPNs, the process software is deployed, accessed, and executed via the secure, encrypted connections between a company's private network and remote users through a third-party service provider. The enterprise service provider (ESP) sets a network access server (NAS) and provides the remote users with desktop client software for their computers. The telecommuters can then dial a toll-free number or attach directly via a cable or DSL modem to reach the NAS and use their VPN client software to access the corporate network and to access, download, and execute the process software.

When using the site-to-site VPN, the process software is deployed, accessed, and executed through the use of dedicated equipment and large-scale encryption, which are used to connect a company's multiple fixed sites over a public network, such as the Internet.

The process software is transported over the VPN via tunneling, which is the process of placing an entire packet within another packet and sending it over a network. The protocol of the outer packet is understood by the network and both points, called tunnel interfaces, where the packet enters and exits the network.

Figure 11:
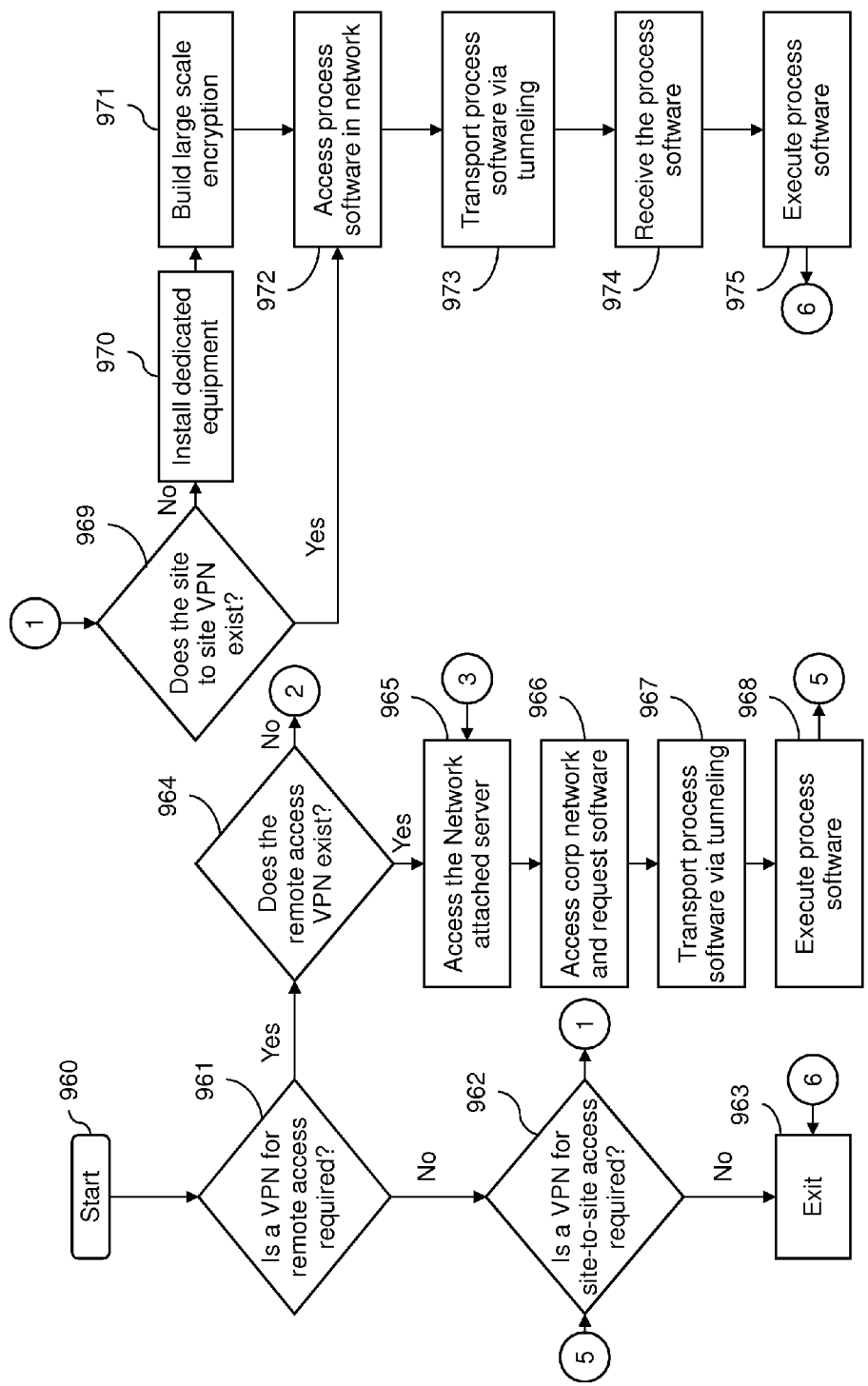
FIG. 11 is a schematic diagram of a virtual private network system according to systems and methods herein.
Figure 12:
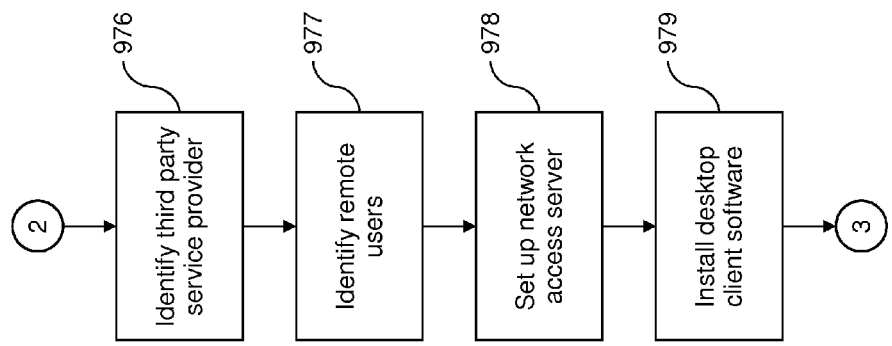
FIG. 12 is a schematic diagram of a virtual private network system according to systems and methods herein.

In FIGS. 11 and 12, step 960 begins the Virtual Private Network (VPN) process. A determination is made to see if a VPN for remote access is required 961. If it is not required, then proceed to 962. If it is required, then determine if the remote access VPN exists 964.

If it does exist, then proceed to 965. Otherwise, identify the third party provider that will provide the secure, encrypted connections between the company's private network and the company's remote users 976. The company's remote users are identified 977. The third party provider then sets up a network access server (NAS) 978 that allows the remote users to dial a toll-free number or attach directly via a cable or DSL modem to access, download, and install the desktop client software for the remote-access VPN 979.

After the remote access VPN has been built, or if it been previously installed, the remote users can then access the process software by dialing into the NAS or attaching directly via a cable or DSL modem into the NAS 965. This allows entry into the corporate network where the process software is accessed 966. The process software is transported to the remote users' desktop over the network via tunneling. That is, the process software is divided into packets and each packet, including the data and protocol, is placed within another packet 967. When the process software arrives at the remote users' desktop, it is removed from the packets, reconstituted, and executed on the remote users' desktop 968.

A determination is made to see if a VPN for site-to-site access is required 962. If it is not required, then proceed to exit the process 963. Otherwise, determine if the site-to-site VPN exists 969. If it does exist, then proceed to 972. Otherwise, install the dedicated equipment required to establish a site-to-site VPN 970. Then build the large-scale encryption into the VPN 971.

After the site-to-site VPN has been built, or if it had been previously established, the users access the process software via the VPN 972. The process software is transported to the site users over the network via tunneling 973. That is, the process software is divided into packets and each packet, including the data and protocol, is placed within another packet 974. When the process software arrives at the remote users' desktop, it is removed from the packets, reconstituted, and executed on the site users' desktop 975. Proceed to exit the process 963.

The terminology used herein is for the purpose of describing particular systems and methods only and is not intended to be limiting of this disclosure. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The corresponding structures, materials, acts, and equivalents of all means or step plus function elements in the claims below are intended to include any structure, material, or act for performing the function in combination with other claimed elements as specifically claimed. The descriptions of the various systems and methods herein have been presented for purposes of illustration, but are not intended to be exhaustive or limited to the systems and methods disclosed. Many modifications and variations will be apparent to those of ordinary skill in the art without departing from the scope and spirit of the described systems and methods. The terminology used herein was chosen to best explain the principles of the systems and methods, the practical application or technical improvement over technologies found in the marketplace, or to enable others of ordinary skill in the art to understand the systems and methods disclosed herein.

What is claimed is:

1. An integrated circuit structure, comprising:
    a memory under repair having variable size blocks of failed memory addresses;
    a first memory operatively connected to a virtual address line, said first memory comprising cells storing data values comprising ranges of said failed memory addresses in said memory under repair;
    a second memory operatively connected to said first memory, matchlines of said first memory driving wordlines in said second memory, each entry in said first memory corresponding to one entry in said second memory and each entry representing a single block of failed memory addresses; and
    a gate having two inputs, a first input being operatively connected to said second memory and a second input being operatively connected to said virtual address line, responsive to a virtual address being an address in one of said ranges of said failed memory addresses in said memory under repair, said gate calculating a physical memory address redirecting said virtual address to an unused good memory location in place of said failed memory address in said memory under repair.

2. The integrated circuit structure according to claim 1, said memory under repair comprising one of:
    SRAM;
    DRAM;
    eDRAM;
    MRAM;
    PCM; and
    Flash.

3. The integrated circuit structure according to claim 1, contents for said first memory and said second memory being generated separate from said integrated circuit structure.

4. The integrated circuit structure according to claim 3, said contents of said first memory and said second memory being programmed in at power-up of said integrated circuit structure.

5. The integrated circuit structure according to claim 1, said ranges of said failed memory addresses comprising one of:
    zero memory addresses; and
    at least one memory address.

6. The integrated circuit structure according to claim 1, said entry in said second memory comprising a mask that designates which bits in said virtual address to change, and
    said gate performing bitwise computation of said virtual address and said entry in said second memory.

7. The integrated circuit structure according to claim 1, further comprising:
    a second gate operatively connected to said matchlines of said first memory; and
    a multiplexer operatively connected to an output of said gate and said virtual address line,
    said second gate detecting a match with any entry in said first memory, an output of said second gate controlling said multiplexer by one of:
        passing said output of said gate when said second gate detects a match with any entry in said first memory, and
        passing said virtual address when said second gate does not detect a match with any entry in said first memory.

8. A computer-implemented method, comprising:
    configuring a Ternary Content Addressable Memory (TCAM) with data values comprising ranges of failed memory addresses in a memory under repair having variable size blocks of failed memory addresses, using a computerized device;
    receiving a virtual address, using said computerized device;
    applying at least a portion of said virtual address to said TCAM, using said computerized device;
    identifying a match in said TCAM indicating said virtual address being in a range of said failed memory addresses in said memory under repair, using said computerized device;
    driving a wordline in an associated random-access memory (RAM) by a matchline in said TCAM, using said computerized device, each entry in said TCAM corresponding to one entry in said RAM and representing a single block of failed memory addresses;
    outputting a mask value from said RAM as a first input to an exclusive-OR (XOR) gate, using said computerized device;

applying said virtual address as a second input to said XOR gate, using said computerized device; and
remapping, using said XOR gate, said virtual address to a physical address for a good memory address in said memory under repair, using said computerized device.

9. The computer-implemented method according to claim 8, said memory under repair comprising one of:
SRAM;
DRAM;
eDRAM;
MRAM;
PCM; and
Flash.

10. The computer-implemented method according to claim 8, further comprising:
identifying failed address locations in said memory under repair, using said computerized device;
programming data values comprising ranges of said failed memory addresses in said TCAM, using said computerized device;
identifying unused good memory locations in said memory under repair, using said computerized device; and
programming data values in said RAM, using said computerized device, said data values comprising a mask that designates which bits in said virtual address to change to produce a physical address in place of said failed memory address in said memory under repair.

11. The computer-implemented method according to claim 8, said range of said failed addresses comprising one of:
zero memory addresses; and
at least one memory address.

12. The computer-implemented method according to claim 8, said entry in said RAM comprising a mask that designates which bits in said virtual address to change.

13. The computer-implemented method according to claim 12, said remapping, using said XOR gate comprising said XOR gate performing bitwise comparison of said virtual address and said entry in said RAM.

14. The computer-implemented method according to claim 13, further comprising:
tapping said matchlines of said TCAM with an OR gate, using said computerized device;
said OR gate detecting a match with any entry in said TCAM, using said computerized device;
passing an output of said XOR gate to a multiplexer (MUX), using said computerized device; and
controlling operation of said MUX by said OR gate, using said computerized device,
said OR gate passing said output of said XOR gate when said OR gate detects a match with any entry in said TCAM, and
said OR gate passing said virtual address when said OR gate does not detect a match with any entry in said TCAM.

15. A system, comprising:
a memory under repair having variable size blocks of failed memory addresses;
a Ternary Content Addressable Memory (TCAM) comprising cells storing data values comprising ranges of said failed memory addresses in said memory under repair;
a random-access memory (RAM) operatively connected to said TCAM, matchlines in said TCAM driving wordlines in said RAM, each entry in said TCAM corresponding to one entry in said RAM and representing a single block of failed memory addresses; and
a processor that
identifies failed memory address ranges in said memory under repair,
identifies unused good memory locations in said memory under repair,
calculates a physical memory address in said unused good memory locations in said memory under repair for a virtual address in said failed memory address ranges, and
redirects said virtual address in said failed memory address ranges to said physical memory address in said unused good memory locations.

16. The system according to claim 15, said memory under repair comprising one of:
SRAM;
DRAM;
eDRAM;
MRAM;
PCM; and
Flash.

17. The system according to claim 15, contents of said TCAM and said RAM being programmed in at power-up of said system.

18. The system according to claim 15, said ranges of said failed memory addresses comprising one of:
zero memory addresses; and
at least one memory address.

19. The system according to claim 15, said entry in said RAM comprising a mask that designates which bits in said virtual address to change, and
said processor performing bitwise comparison of said virtual address and said entry in said RAM.

20. The system according to claim 15, said processor comprising an exclusive-OR (XOR) gate, and an input to said TCAM comprising a virtual address line, said system further comprising:
an OR gate operatively connected to said matchlines of said TCAM; and
a multiplexer (MUX) operatively connected to an output of said XOR gate and said virtual address line,
said processor detecting a match with any entry in said TCAM using said OR gate, and
said processor controlling said MUX by one of:
passing said output of said XOR gate when said OR gate detects a match with any entry in said TCAM, and
passing said virtual address when said OR gate does not detect a match with any entry in said TCAM.

* * * * *